(12) United States Patent
Li et al.

(10) Patent No.: US 9,334,159 B2
(45) Date of Patent: May 10, 2016

(54) INTEGRATED CHIP WITH MICRO-ELECTRO-MECHANICAL SYSTEM AND INTEGRATED CIRCUIT MOUNTED THEREIN AND METHOD FOR MANUFACTURING THE SAME

(71) Applicant: MEMSensing Microsystems (Suzhou, China) Co., Ltd., Suzhou, Jiangsu Province (CN)

(72) Inventors: Gang Li, Suzhou (CN); Wei Hu, Suzhou (CN); Jia-Xin Mei, Suzhou (CN); Rui-Fen Zhuang, Suzhou (CN)

(73) Assignee: MEMSENSING MICROSYSTEMS (SUZHOU, CHINA) CO., LTD., Suzhou, Jiangsu Province (CN)

( * ) Notice: Subject to any disclaimer, the term of this patent is extended or adjusted under 35 U.S.C. 154(b) by 244 days.

(21) Appl. No.: 14/052,669

(22) Filed: Oct. 11, 2013

(65) Prior Publication Data

US 2014/0332909 A1    Nov. 13, 2014

(30) Foreign Application Priority Data

May 9, 2013 (CN) .......................... 2013 1 0168305

(51) Int. Cl.
*H01L 29/84* (2006.01)
*H01L 23/538* (2006.01)
*H01L 25/065* (2006.01)
*B81C 1/00* (2006.01)

(52) U.S. Cl.
CPC ..... *B81C 1/00238* (2013.01); *B81C 2203/0792* (2013.01)

(58) Field of Classification Search
CPC ......... H01L 21/56; H01L 24/96; H01L 23/10; H01L 23/3677
USPC ............................................ 257/415; 438/51
See application file for complete search history.

(56) References Cited

U.S. PATENT DOCUMENTS

| 6,624,003 | B1* | 9/2003 | Rice | B81B 7/007 438/106 |
| 7,998,776 | B1* | 8/2011 | Li | B81C 1/00182 257/419 |
| 2004/0195669 | A1* | 10/2004 | Wilkins | B81B 7/0006 257/698 |
| 2006/0252229 | A1* | 11/2006 | Joly | B81C 1/00253 438/455 |
| 2010/0207217 | A1* | 8/2010 | Zuniga-Ortiz | B81C 1/0023 257/415 |
| 2010/0258950 | A1* | 10/2010 | Li et al. | 257/777 |
| 2011/0127620 | A1* | 6/2011 | Wang | B81C 1/00246 257/415 |
| 2012/0056279 | A1* | 3/2012 | Huang et al. | 257/415 |
| 2013/0168784 | A1* | 7/2013 | Lee | B81B 7/007 257/415 |
| 2013/0277774 | A1* | 10/2013 | Frey | B81B 7/007 257/415 |
| 2013/0334621 | A1* | 12/2013 | Classen | B81B 3/0018 257/415 |

* cited by examiner

*Primary Examiner* — Vongsavanh Sengdara
*Assistant Examiner* — Thai T Vuong
(74) *Attorney, Agent, or Firm* — Cheng-Ju Chiang

(57) ABSTRACT

The invention relates to an integrated chip with an MEMS and an integrated circuit mounted therein and a method for manufacturing the same. The method includes the steps of: S1: providing a first chip, wherein the first chip comprises a first substrate, an MEMS component layer formed on the first substrate and comprising a first electrical bonding point disposed on MEMS the component layer; S2: providing a second chip with an IC integrated circuit, wherein the second chip comprises a second lead layer and a second electrical bonding point; S3: bonding the first electrical bonding point and the second electrical bonding point; S4: processing a thinning operation for the bottom surface of the first substrate; and S5: forming an electrical connection layer electrically connected to an external circuit on the bottom surface of the first substrate.

14 Claims, 10 Drawing Sheets

INTEGRATED CHIP WITH MICRO-ELECTRO-MECHANICAL SYSTEM AND INTEGRATED CIRCUIT MOUNTED THEREIN AND METHOD FOR MANUFACTURING THE SAME

TECHNICAL FIELD

The present invention relates an integrated chip with a micro-electro-mechanical system (MEMS) and an integrated circuit mounted therein, and a method for manufacturing the same.

BACKGROUND

The MEMS technology is an advanced technology with fast development speed in recent years. Compared with the electronic components manufactured by the traditional technology, the components manufactured by the MEMS technology have notable advantages in volume, power consumption, weight, and cost. Besides, the MEMS components can be of mass production through advanced semiconductor manufacturing process. Nowadays, the MEMS components are actually applied in pressure sensors, accelerometers, gyroscopes, and silicon microphones, and the like.

However, the MEMS components also need to be electrically connected and integrated together with the integrated circuits (CMOS/Bipolar) including driver, detecting, signal processing, and the like to jointly form an independent system for integrated function. At present, there are a variety of available integration solutions, mainly two integration solutions: single-chip integration and multi-chip integration. The case where the circuit and the MEMS components are fabricated on the same chip is called single-chip integration. Regarding the single-chip integration, there are two types of processes among which one is called pre-CMOS and the other is called POST-CMOS determined by the manufacture sequence of the mountable components. The Pre-CMOS is a process with the MEMS component fabricated before the integrated circuit in the same chip. However, this process may result in polluting the later integrated circuit and may further pollute the corresponding manufacture machine. As a result, any other integrated circuits manufactured by such manufacture machine with the process may also be disabled. In a POST-CMOS process, the MEMS component is fabricated after the integrated circuit. Usually, the MEMS component needs high temperature in manufacturing, which may easily damage the integrated circuit. Although, disadvantages arising from the Pre-CMOS process and the POST-CMOS process can be avoided certain methods, such avoidance will result in the complexity of the process and accordingly enhance the manufacture cost. Consequently, the application range of the single-chip integration process is limited, and many MEMS components are selected to avoid using the single-chip integration process.

The multi-chip integration is another process with the MEMS component and the integrated circuit enclosed in a single encapsulation. In this process, different chips are firstly selected for manufacturing the MEMS component and the integrated circuit respectively, and then the chips are adjacently arranged in the same chip substrate. The MEMS component and the integrated circuit are electrically connected by means of wire bonding. Finally, the chips are packed through a ceramic or metal package process. The disadvantages of the solution are as follows: Firstly, because the electrical connection between the MEMS component and the integrated circuit is implemented by using a long wire, many interference signals may be introduced, resulting that the overall integration function of the system may be reduced. Secondly, because the MEMS components are generally movable parts whose size is of a micrometer scale, and these parts are more vulnerable. Therefore, plastic package cannot be used while integration package, but ceramic or metal package is used. This increases the cost. Usually the package cost of the MEMS components is 10-100 times the cost of the MEMS components.

Therefore, it is a technical issue to be addressed for those skilled in the art as how to solve the disadvantages in the prior art to achieve a low-cost integration solution.

SUMMARY

One objective of the present invention to provide an integrated chip with an MEMS and an integrated circuit mounted therein, which is capable of improving the sensitivity.

To achieve the above objective, the present invention employs the following technical solution: an integrated chip with an MEMS and an integrated circuit mounted therein, comprising a first chip comprising a substrate, an MEMS component layer disposed on the substrate and comprising a movable sensitive portion, a first lead layer formed below the movable sensitive portion, a first electrical bonding point disposed on the MEMS component layer; wherein the integrated chip with an MEMS and an integrated circuit mounted therein further comprises a second chip having an integrated circuit, and an electrical connection layer, the second chip being disposed on the first chip, wherein the second chip comprises a second lead layer and a second electrical bonding point bonded with the first electrical bonding point, the second lead layer and the first lead layer being symmetrically disposed on two sides of the movable sensitive portion, and the first chip further comprises an electrical connection portion configured to connected the first electrical bonding point to an electrical connection layer.

As a further improvement of the present invention, the first chip further comprises an isolation portion disposed in the substrate and disposed around the periphery of the electrical connection portion.

As a further improvement of the present invention, the isolation portion comprises a through hole passing through the substrate, a polysilicon layer disposed in the through hole and a silicon oxide layer disposed around the periphery of the polysilicon layer.

As a further improvement of the present invention, the isolation portion comprises a through hole passing through the substrate and a silicon oxide filling the through hole.

As a further improvement of the present invention, the substrate comprises a top surface facing towards the second chip and a bottom surface disposed opposite the top surface.

As a further improvement of the present invention, the isolation portion extends from the top surface of the substrate towards the bottom surface of the substrate and passes through the substrate.

As a further improvement of the present invention, the isolation portion is annular.

As a further improvement of the present invention, the second electrical bonding point is disposed on the outer side of the movable sensitive portion.

As a further improvement of the present invention, the first chip further comprises a first package ring disposed on the MEMS component layer and disposed on the outer side of the first electrical bonding point, and the second chip further comprises a second package ring bonded with the first package ring and disposed on the outer side of the second electrical bonding point.

As a further improvement of the present invention, the first electrical bonding point and the first package ring are formed from germanium, the second electrical bonding point and the second package ring bonded respectively with the first electrical bonding point and the first package ring which are formed from germanium are formed from aluminum; or the first electrical bonding point and the first package ring are formed from gold, the second electrical bonding point and the second package ring bonded respectively with the first electrical bonding point and the first package ring which are formed from gold are formed from polysilicon.

Another objective of the present invention is to provide an integrated chip with an MEMS and an integrated circuit mounted therein and a method for manufacturing the same, to improve the sensitivity, and reduce the package volume and cost.

To achieve the above objective, the present invention employs the following technical solution: a method for manufacturing an integrated chip with an MEMS and an integrated circuit mounted therein, comprising the steps of:

S1: providing a first chip, wherein the first chip comprises a first substrate comprising oppositely disposed top surface and bottom surface, an isolation portion disposed on the first substrate extending from the top surface of the first substrate towards the bottom surface of the first substrate, an MEMS component layer formed on the top surface of the first substrate and comprising a movable sensitive portion, a first lead layer formed below the movable sensitive portion, a first electrical bonding point disposed on the MEMS component layer, and an electrical connection portion formed in the isolation portion and electrically connected to the first electrical bonding point;

S2: providing a second chip having an integrated circuit, wherein the second chip comprises a second substrate, a second lead layer disposed on the second substrate, and a second electrical bonding point disposed on the second substrate;

S3: bonding the first electrical bonding point with the second electrical bonding point, wherein the second lead layer and the first lead layer are symmetrically disposed on two sides of the movable sensitive portion;

S4: processing a thinning operation for the bottom surface of the first substrate of the boned first chip in step S3 to expose the isolation portion; and S5: forming an electrical connection layer electrically connected to an external circuit on the bottom surface of the first substrate thinned in step S4.

As a further improvement of the present invention, the first chip in step S1 is formed by using the steps of:

S11: providing a first substrate which comprises oppositely disposed top surface and bottom surface, and oxidizing the top surface of the first substrate to obtain an oxide layer;

S12: drawing on the oxide layer obtained in step S11 to form a through-hole pattern.

S13: forming a through hole in the first substrate according to the through-hole pattern obtained in step S12, and forming the electrical connection portion in the through hole and the electrical connection portion being surrounded by the through hole;

S14: depositing a silicon oxide layer in the through hole obtained in step S13, and filling the through hole deposited the silicon oxide layer with a polysilicon to form a polysilicon layer, wherein the silicon oxide layer and the polysilicon layer are combined to form the isolation portion;

S15: removing the oxide layer formed in step S11; and

S16: forming the MEMS component layer comprising a movable sensitive portion, and the first lead layer on the top surface of the first substrate with the oxide layer removed, the first lead layer disposed below the movable sensitive portion, forming the first electrical bonding point electrically connected to the electrical connection portion formed in step S13 on the MEMS component layer.

As a further improvement of the present invention, step S14 is replaced by step S14': depositing the silicon oxide in the through hole obtained in step S13 to form the isolation portion.

As a further improvement of the present invention, the first electrical bonding point is made of germanium, and the second electrical bonding point is made of aluminum.

As a further improvement of the present invention, the first electrical bonding point is made of gold, and the second electrical bonding point is made of polysilicon.

As a further improvement of the present invention, the second electrical bonding point is disposed on the outer side of the movable sensitive portion.

As a further improvement of the present invention, the first chip provided in step S1 further comprises a first package ring disposed on the outer side of the first electrical bonding point, and the second chip provided in step S2 further comprises a second package ring disposed on the outer side of the second electrical bonding point.

As a further improvement of the present invention, the electrical connection layer in step S5 is specifically formed by using the steps of:

S51: depositing a silicon oxide on the bottom surface of the first substrate thinned in step S4 to form an oxide layer;

S52: removing a part of the oxide layer to expose the electrical connection portion and depositing a first metal layer and forming a metal routing;

S53: depositing a passivation layer;

S54: removing a part of passivation layer to expose a part of metal routing, and depositing a second metal layer on the exposed metal routing; and S55: forming a welding bump on the second metal layer by using the ball grid array package technology.

The beneficial effects of the present invention are as follows:

The present invention achieves the wafer level chip scale packaging by using the method for manufacturing an integrated chip with an MEMS and an integrated circuit mounted therein, reducing the volume of the integrated chip. Additionally, the first chip is bonded with the second chip, and the second lead layer is disposed on the second chip, wherein the second lead layer and the first lead layer are symmetrically disposed on two sides of the movable sensitive part. Therefore, the bonding gap between the first chip and the second chip may be used reasonably, the parasitic capacitance is effectively used as the detecting capacitance, and the sensitivity of the integrated chip is increased.

DETAILED DESCRIPTION OF THE EMBODIMENTS

Figure 1:
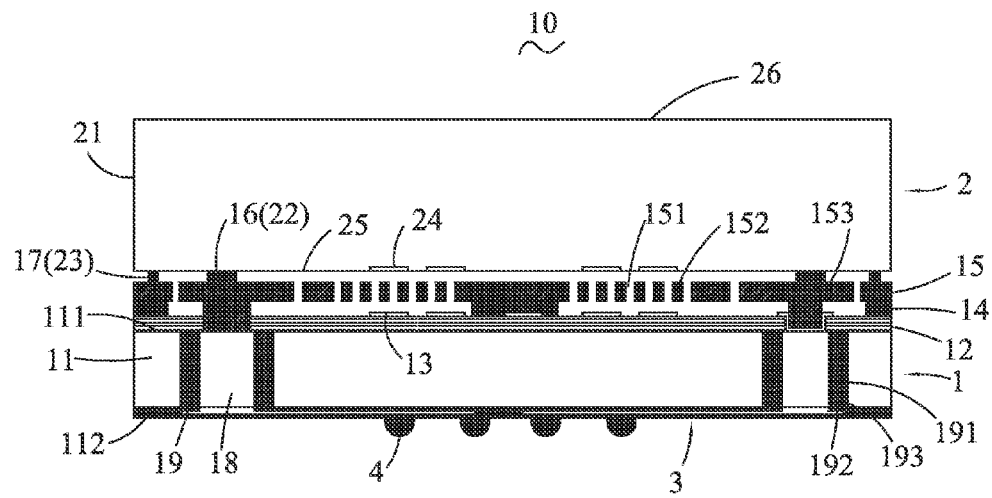
FIG. 1 is a schematic structural view of an integrated chip with an MEMS and an integrated circuit mounted therein according to an embodiment of the present invention.

Referring to FIG. 1, as provided in one embodiment of the present invention, an integrated chip with an MEMS and an integrated circuit mounted therein comprises a first chip 1, a second chip 2 bonded with the first chip 1 and having an integrated circuit (not shown), and an electrical connection layer 3 disposed on the first chip 1 and configured to be electrically connected to an external circuit. In this embodiment, the external circuit corresponding to the electrical connection layer 3 is an application-specific integrated circuit (ASIC).

The first chip 1 comprises a first substrate 11, an oxide layer 12 disposed on the first substrate 11, a first lead layer 13 disposed on the oxide layer 12, a sacrifice layer 14, an MEMS component layer 15, a first electrical bonding point 16 and a first package ring 17 which are disposed on the MEMS component layer 15, an electrical connection portion 18 disposed in the first substrate 11, and an isolation portion 19 disposed around the periphery of the electrical connection portion 18. The first substrate 11 comprises oppositely disposed top surface 111 and bottom surface 112. The top surface 111 faces towards the second chip 2. The first lead layer 13 is configured to output a signal. The first substrate 11 may be a silicon substrate.

The above-mentioned first chip 1 may be considered as an MEMS component, and the first chip 1 may be such an MEMS component as an accelerometer, a gyroscope, or the like. The MEMS component layer 15 is a movable structure, and comprises a narrow groove 151, a movable sensitive portion 152 formed by the narrow groove 151, and a fixing portion 153 disposed on the outer side of the movable sensitive portion 152. The narrow groove 151 is obtained through photolithography and etching. The first lead layer 13 is disposed below the movable sensitive portion 152. The first electrical bonding point 16 and the first package ring 17 are fixed to the fixing portion 153, and the first package ring 17 is disposed on the outer side of the first electrical bonding point 16. The first electrical bonding point 16 is made of germanium or gold, and the material of the first package ring 17 is the same as that of the first electrical bonding point 16.

The electrical connection portion 18 electrically connects the first electrical bonding point 16 to the electrical connection layer 3. The isolation portion 19 disposed around the periphery of the electrical connection portion 18, thereby electrically isolating the electrical connection portion 18 from other parts of the first substrate 11.

The isolation portion 19 extends from the top surface 111 of the first substrate 11 towards the bottom surface 112 of the first substrate 11 and passes through the first substrate 11. In this embodiment, the cross-section of the electrical connection portion 18 is circle-shaped, and the isolation portion 19 is annular. The electrical connection portion 18 may be in another shape, such as a quadrilateral or an ellipse, and the isolation portion 19 may be in another shape accommodating the shape of the electrical connection portion 18.

In this embodiment, the isolation portion 19 comprises a through hole 191 passing through the first substrate 11, a polysilicon layer 192 disposed in the through hole 191, and a silicon oxide layer 193 disposed around the periphery of the polysilicon layer 192. Admittedly, both of the polysilicon layer 192 and the silicon oxide layer 193 may be replaced by silicon oxide filled in the through hole 191.

The second chip 2 comprises a second substrate 21 comprising oppositely disposed first surface 26 and second surface 25, a second lead layer 24 disposed on the second surface 25 of the second substrate 21, and a second electrical bonding point 22 and a second package ring 23 which are disposed on the second surface 25 of the second substrate 21. The second package ring 23 is disposed on the outer side of the second electrical bonding point 22. The second surface 25 of the second chip 2 faces towards the first chip 1. The second electrical bonding point 22 is bonded with the first electrical bonding point 16, and the second package ring 23 is bonded with the first package ring 17. The second lead layer 24 has the same function as the first lead layer 13, is configured to output a signal. The first lead layer 13 and the second lead layer 24, with the movable sensitive portion 152 as a symmetry axis, are symmetrically disposed on two sides of the movable sensitive portion 152.

Because the second lead layer 24 and the first lead layer 13 are symmetrically disposed on two sides of the movable sensitive portion 152, the displacement change caused by the planar motion of the MEMS component layer 15 in the first chip 1 may be converted to a differential capacitance change which is vertically symmetrical. In this way, the sensitivity of the first chip 1 is effectively increased. In this embodiment, the second chip 2 is disposed above the first chip 1, the electrical connection layer 3 is disposed below the first chip 1, and the first lead layer 13 and the second lead layer 24 are symmetrically disposed on the upper side and the lower side of the movable sensitive portion 152 respectively.

In this embodiment, the materials of the first electrical bonding point 16, the first package ring 17, the second electrical connection point 22 and the second package ring 23 may by selected as follows: when the first electrical bonding point 16 and the first package ring 17 are formed from germanium, the second electrical bonding point 22 and the second package ring 23 bonded respectively with the first electrical bonding point 16 and the first package ring 17 which are formed from germanium are formed from aluminum. When the first electrical bonding point 16 and the first package ring 17 are formed from gold, the second electrical bonding point 22 and the second package ring 23 bonded respectively with the first electrical bonding point 16 and the first package ring 17 which are formed from gold are formed from polysilicon. By using the above materials, the first electrical bonding point 16, the second electrical connection point 22, the first package ring 17 and the second package ring 23 are thinned, thereby reducing the whole volume of the integrated chip 10 with an MEMS and an integrated circuit mounted therein.

The electrical connection layer 3 comprises a welding bump formed through the ball grid array package technology.

Because the integrated chip 10 with an MEMS and an integrated circuit mounted therein is provided with the second chip 2 bonded with the first chip 1, the second chip 2 comprises the second lead layer 24, and the second lead layer 24 and the first lead layer 13 are symmetrically disposed on two sides of the movable sensitive portion 152. Therefore, the bonding gap between the first chip 1 and the second chip 2 may be used reasonably, the parasitic capacitance is effectively used as the detecting capacitance, and the sensitivity of the integrated chip 10 with an MEMS and an integrated circuit mounted therein is increased.

The method of manufacturing the integrated chip 10 with an MEMS and an integrated circuit mounted therein of the present invention comprises the following steps S1 to S6.

Figure 7:
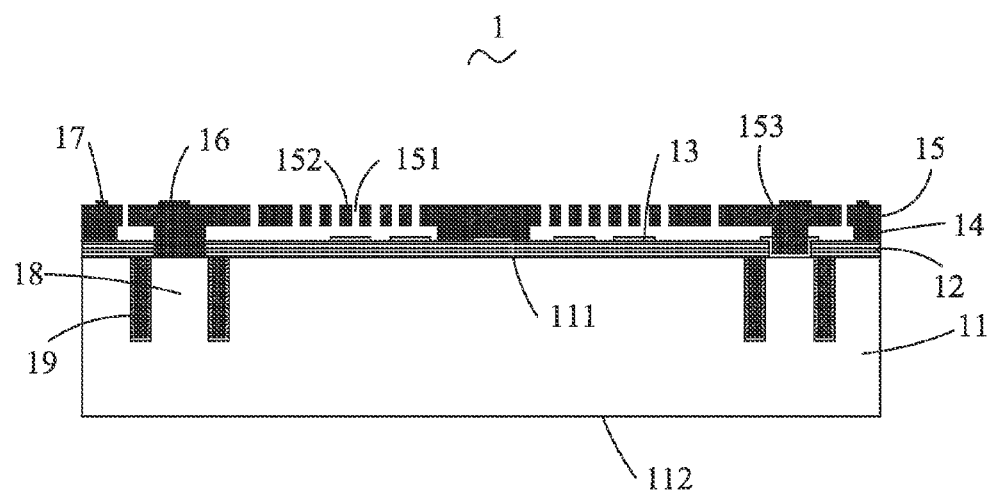

Referring to FIG. 7, in step S1, a first chip 1 is provided. The first chip 1 comprises a first substrate 11 comprising oppositely disposed top surface 111 and bottom surface 112, an oxide layer 12 disposed on the top surface 111 of the first substrate 11, a first lead layer 13 disposed on the oxide layer 12, a sacrifice layer 14 and an MEMS component layer 15, a first electrical bonding point 16 and a first package ring 17 which are disposed on the MEMS component layer 15, an isolation portion 19 disposed on the first substrate 11 and extending from the top surface 111 of the first substrate 11 towards the bottom surface 112 of the first substrate 11, and an electrical connection portion 18 disposed in the isolation portion 19 and electrically connected to the MEMS component layer 15. The first lead layer 13 is configured to output a signal. The first substrate 11 may be a silicon substrate.

The MEMS component layer 15 comprises a narrow groove 151, a movable sensitive portion 152 formed by the narrow groove 151, and a fixing portion 153 disposed on the outer side of the movable sensitive portion 152. The narrow groove 151 is obtained through the photolithography and the etching. The first lead layer is disposed below the movable sensitive portion 152. The first electrical bonding point 16 and the first package ring 17 are fixed on the fixing portion 153, and the first package ring 17 is disposed on the outer side of the first electrical bonding point 16. The above mentioned first chip 1 may be considered as the MEMS component, and the first chip 1 may be such an MEMS component as an accelerometer, a gyroscope, or the like.

Referring to FIG. 2 to FIG. 7, the first chip in step S1 is formed by using steps S11 to S16.

Figure 2:
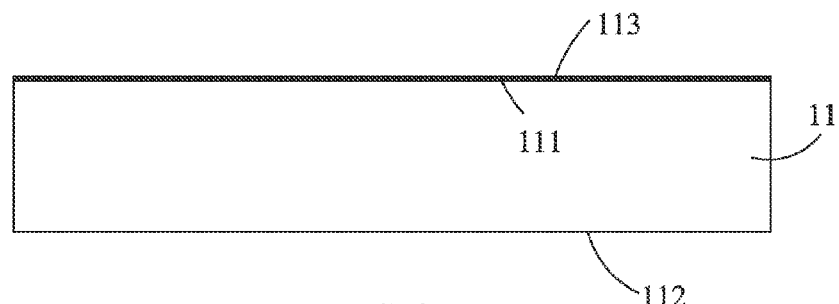
FIGS. 2-7 are flowcharts of manufacturing a first chip of the integrated chip with an MEMS and an integrated circuit mounted therein illustrated in FIG. 1.

Referring to FIG. 2, in step S11, the first substrate 11 is provided. The first substrate 11 comprises oppositely disposed top surface 111 and bottom surface 112. The top surface 111 of the first substrate 11 is oxidized to obtain an oxide layer 113. The oxide layer 113 is made of silicon oxide. The oxide layer 113 may be formed by using the process of low pressure chemical vapor deposition (LPCVD), or plasma enhanced chemical vapor deposition (PECVD), or thermal oxidation.

Figure 3:
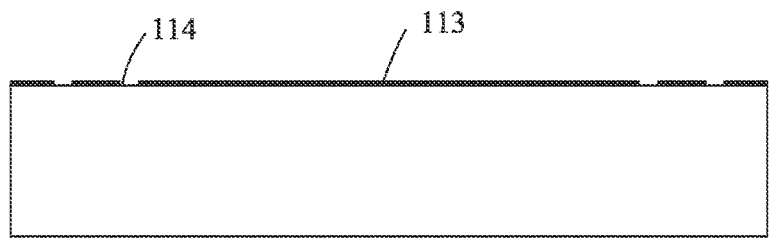

Referring to FIG. 3, in step S12, a through-hole pattern 114 is formed by drawing on the oxide layer 113 obtained in step S11. In this step, the through-hole pattern 114 is obtained by removing a part of the silicon oxide of the oxide layer 113 through the process of photolithography and dry etching or photolithography and wet etching, or the like. In this embodiment, four through-hole patterns 114 are formed on the oxide layer 113, and the through-hole patterns 114 are annular. The oxide layer 113 mainly functions as a mask.

Figure 4:

Referring to FIG. 4, in step S13, a through hole 115 is formed in the first substrate 11 according to the through-hole pattern obtained in step S12 by using the deep reactive ion etching (DRIE) process, and meanwhile the electrical connection portion 18 is formed in the through hole 115, which is surrounded by the through hole 115. From this step it is seen that the electrical connection portion is formed in the first substrate 11 through the isolation by the through hole 115. Because in step S12 four through-hole patterns are formed and the through-hole patterns are annular, in step S14, four annular through holes 115 are correspondingly formed, meanwhile, the cross-sections of the corresponding four electrical connection portions 18 are circular.

Figure 5:
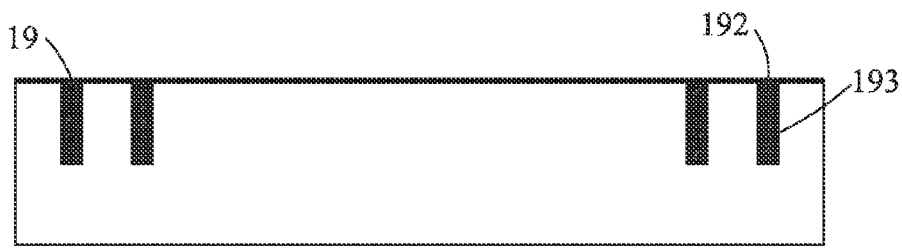

Referring to FIG. 5, in step S14, a silicon oxide layer is deposited in the through hole obtained in step S13, and the through hole where the silicon oxide layer 191 is deposited is filled with a polysilicon to form a polysilicon layer 192, wherein the silicon oxide layer 191 and the polysilicon layer 192 are combined to form the isolation portion 19. Because four annular through holes are formed in step S133, in this step four annular isolation portions 19 are correspondingly formed.

Figure 6:

Referring to FIG. 6, in step S15, the oxide layer formed in step S11 is removed.

Referring to FIG. 7, in step S16, an MEMS component layer 15 comprising a movable sensitive portion 152, a first lead layer 13 disposed on below the movable sensitive portion 152 and configured to output a signal, and the like is formed on the top surface 111 of the first substrate 11 with the oxide layer removed. In addition, a first electrical bonding point 16 electrically connected to the electrical connection portion 18 formed in step S13 and a first packaging ring 17 are formed on the MEMS component layer 15. In this step, the MEMS component layer 15, the first lead layer 13, and the like pertain to common technical means in the prior art. For example, the MEMS component layer 15 may be manufactured by using an epitaxial polysilicon process, which is not described herein any further.

Figure 22:
FIG. 22 is another schematic structural view of a substrate of the first chip during manufacturing as illustrated in FIG. 6.

Step 14 may also be replaced by step S14' of depositing the silicon oxide in the through hole obtained in step S13 to form an isolation portion 19'. For details, reference may be made to FIG. 22.

Figure 8:
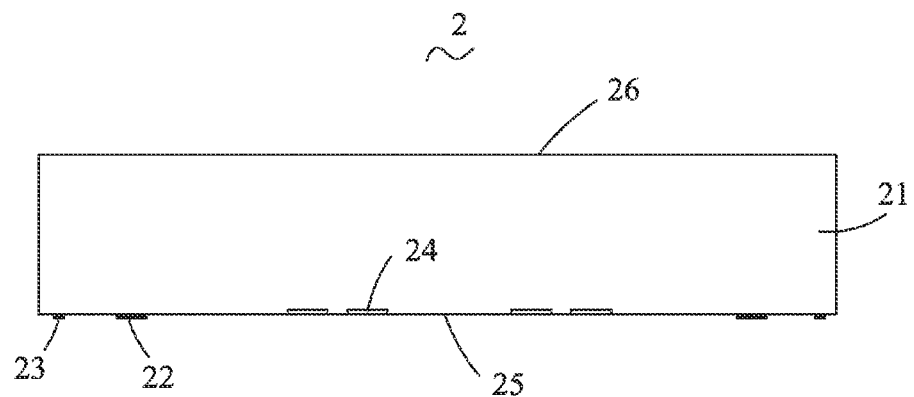
FIG. 8 is a schematic structural view of a second chip of the integrated chip with an MEMS and an integrated circuit mounted therein illustrated in FIG. 1.

Referring to FIG. 8, in step S2, a second chip 2 having an integrated circuit is provided. The second chip 2 comprises a second substrate 21 comprising oppositely disposed first surface 26 and second surface 25, a second lead layer 24 disposed on the second substrate 21, and a second electrical bonding point 22 and a second package ring 23 which are disposed on the second substrate 21. The second lead layer functions the same as the first lead layer, and is configured to output a signal. The second electrical bonding point 22 is disposed on the outer side of the second lead layer 24, and the second package ring 23 is disposed on the outer side of the second electrical bonding point 22.

Figure 9:
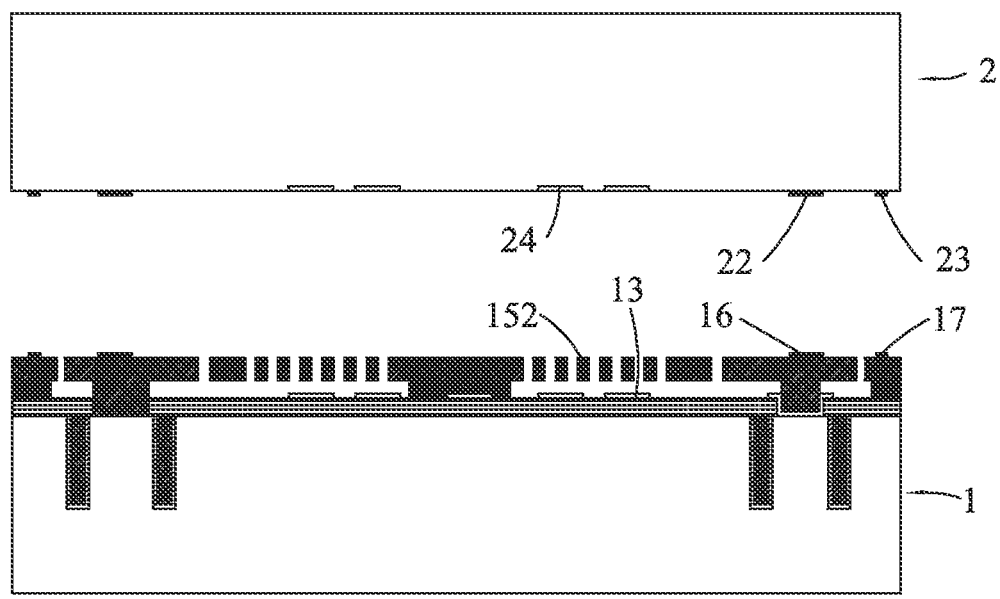
FIGS. 9-19 are a part of flowcharts of manufacturing the integrated chip with an MEMS and an integrated circuit mounted therein illustrated in FIG. 1.
Figure 10:
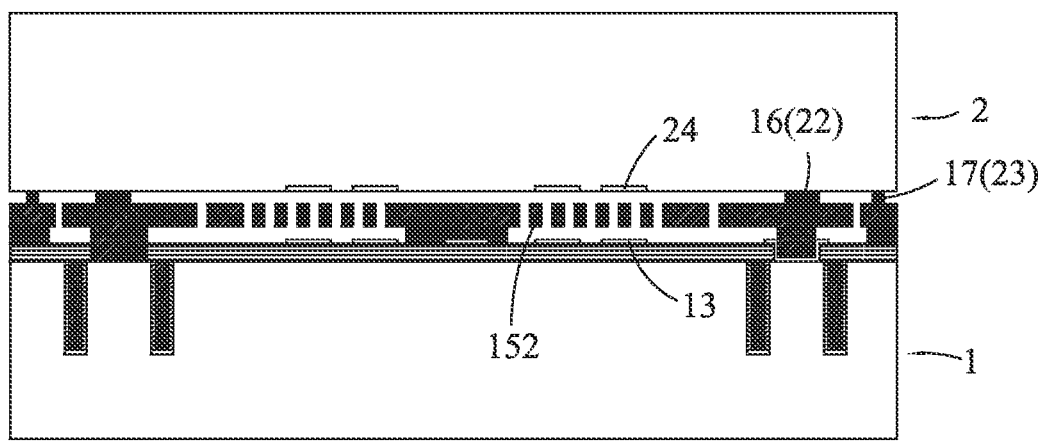

Referring to FIG. 9 and FIG. 10, in step S3, the first electrical bonding point 16 is bonded with the second electrical bonding point 22, the first package ring 17 is bonded with the second package ring 23, and the first lead layer 13 and the second lead layer 24 are symmetrically disposed on two sides of the movable sensitive portion 152. In this embodiment, the second chip 2 is disposed above the first chip 1, and the first lead layer 24 and the second lead layer 23 are relatively disposed on the upper side and the lower side of the movable sensitive portion 152.

Figure 11:
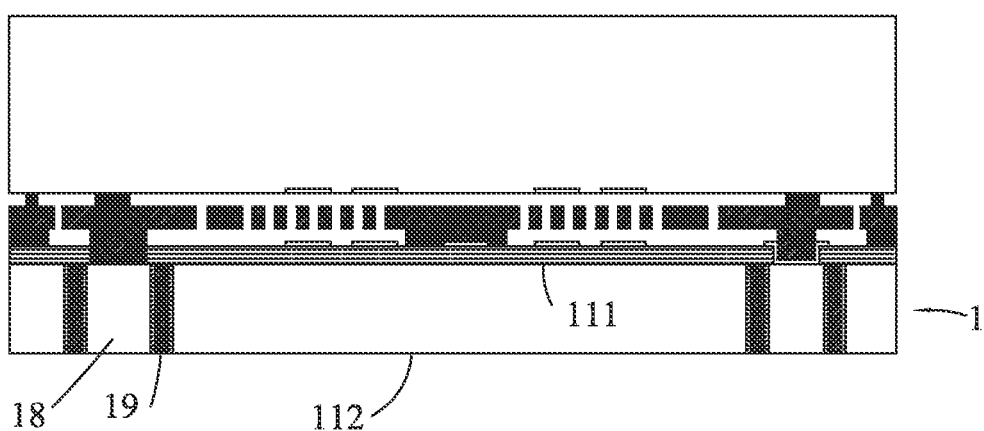
Figure 12:
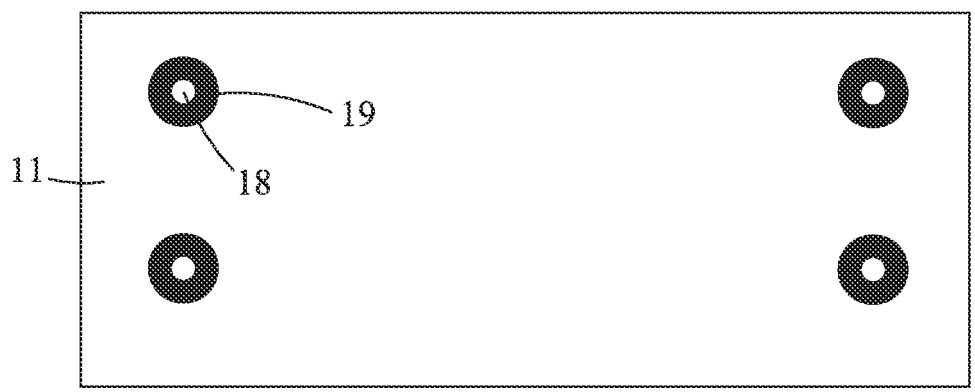

Referring to FIG. 11 and FIG. 12, in step S4, a thinning operation is performed for the bottom surface 112 of the first substrate 11 of the boned first chip 1 in step S3 to expose the isolation portion 19. In this step, the first substrate 11 is thinned through the CMP thinning manner. After thinning, the thinned surface disposed opposite to the top surface 111 of the first substrate 11 is still called a bottom surface 112.

Figure 20:
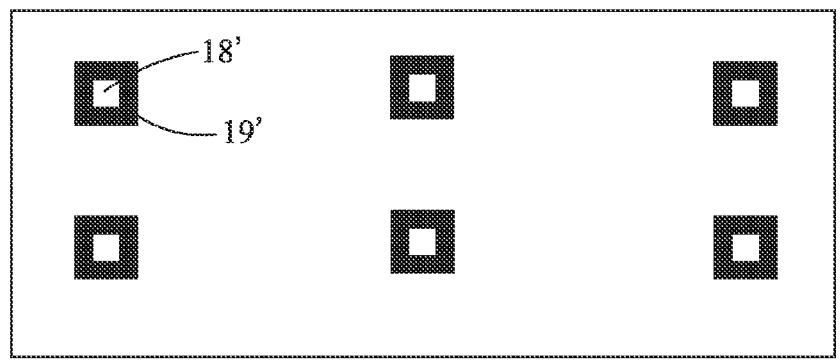
FIG. 20 is a top view of a first chip of an MEMS component according to another embodiment of the present invention.
Figure 21:
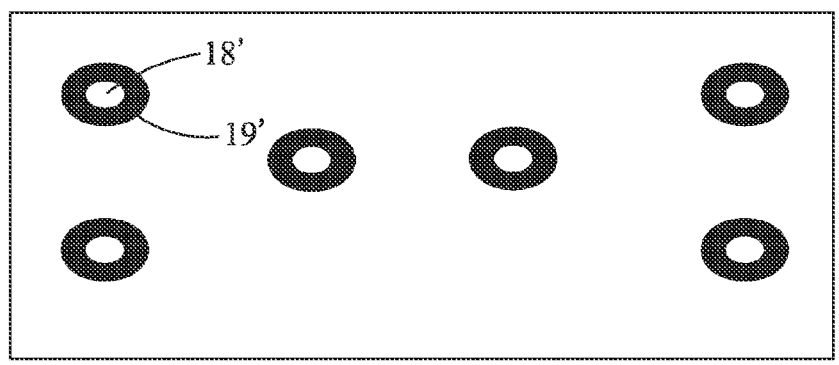
FIG. 21 is a top view of a first chip of an MEMS component according to yet another embodiment of the present invention.

Because four electrical connection portions 18 with circular cross-section are formed in steps S23 and S24, four electrical connection portions 18 with circular cross section may be observed from the bottom surface 112 of the first substrate 11. In this embodiment, the electrical connection portions 18 are symmetrically disposed on two sides of the first substrate 11. Admittedly, electrical connection portions 18' may be configured in other shapes or numbers. For example, the number of electrical connection portions 18' is six and the cross sections of electrical connection portions 18' are quadrilateral or oval, whereas the corresponding isolation portions 19' are also configured to other shapes. Other arrangements may be applied according to the specific design. For details, reference may be made to FIG. 20 and FIG. 21.

Figure 19:
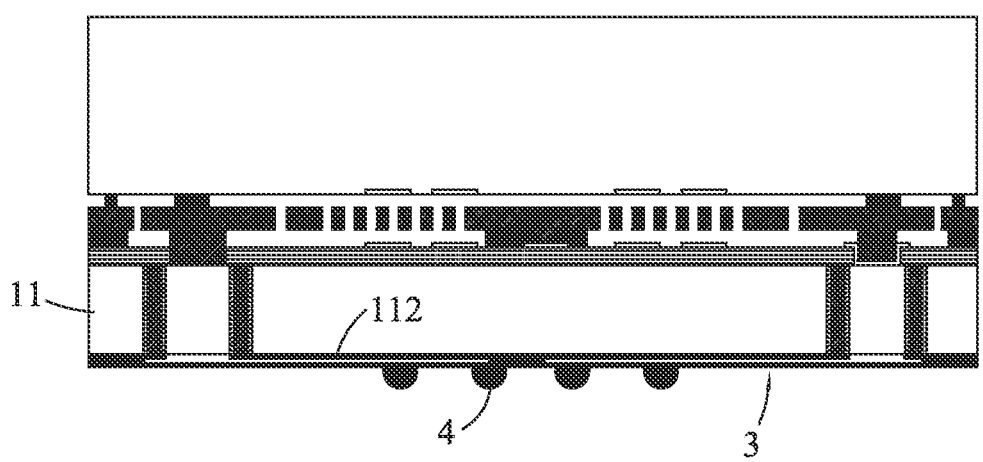

Referring to FIG. 19, in step S5, an electrical connection layer 3 electrically connected to an external circuit on the bottom surface 112 of the first substrate 11 thinned in step S4 is formed.

Referring to FIG. 13 to FIG. 19, the electrical connection layer in step S5 is specifically formed through the following process steps S51 to S55.

Figure 13:
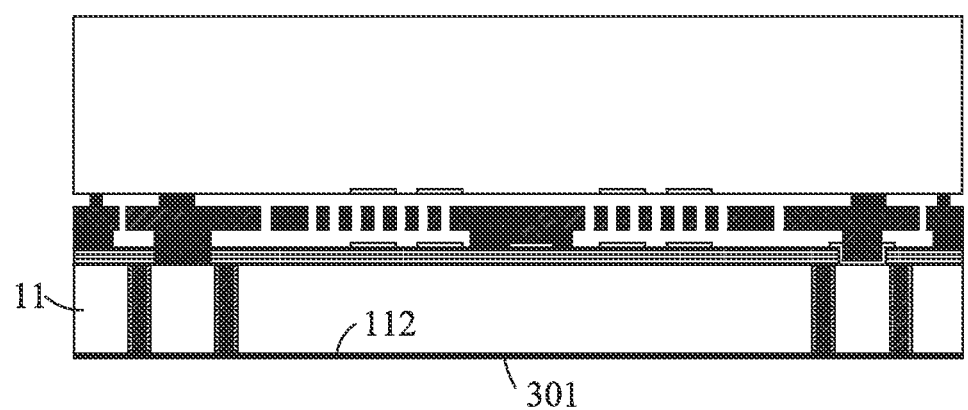

Referring to FIG. 13, in step S51, a silicon oxide is deposited on the bottom surface 112 of the first substrate 11 thinned in step S4 to form an oxide layer 301. The oxide layer 301 mainly functions as a mask. The oxide layer 301 is manufactured by using various deposition processes, such as low pressure chemical vapor deposition (LPCVD), or plasma enhanced chemical vapor deposition (PECVD), or thermal oxidation process.

Figure 14:
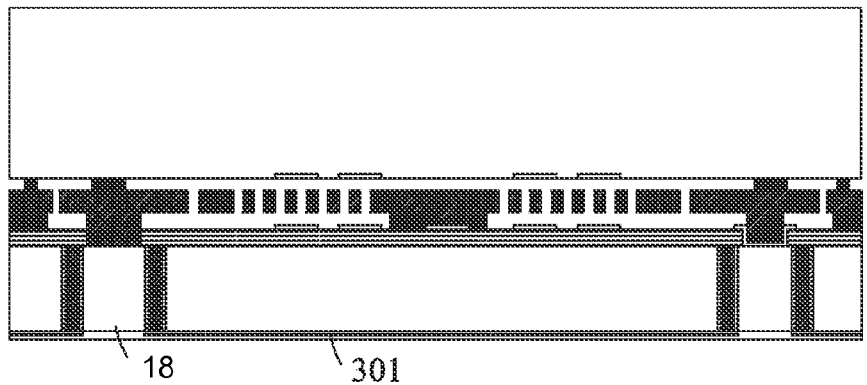
Figure 15:
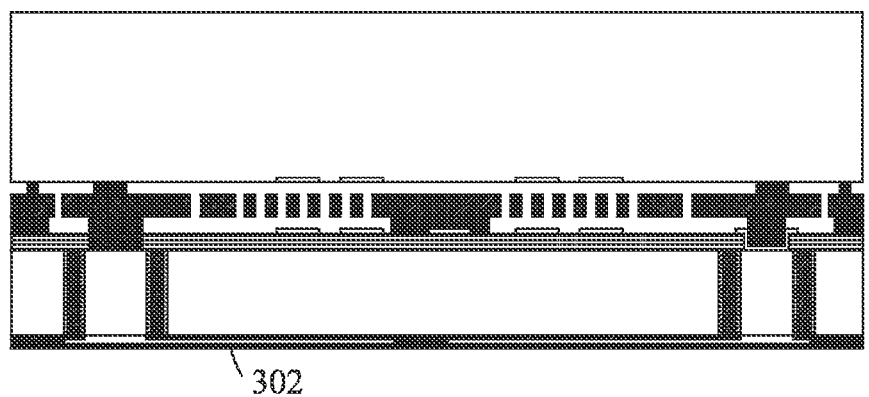
Figure 16:
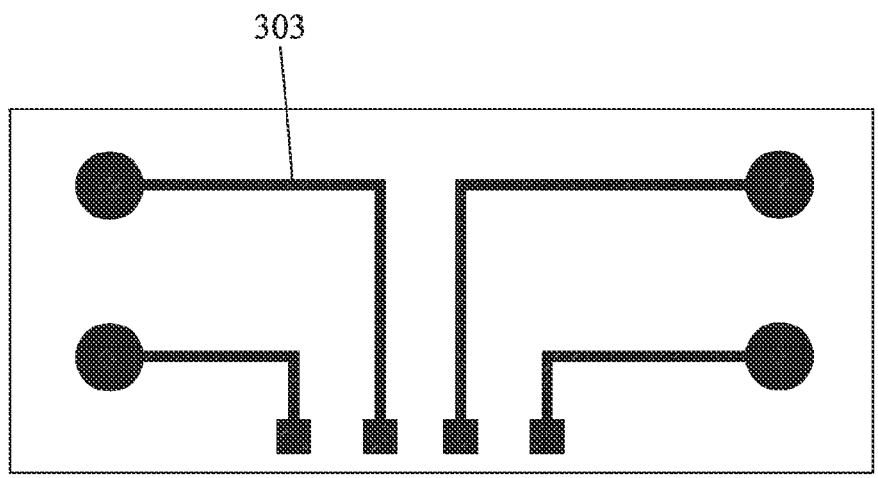

Referring to FIG. 14 to FIG. 16, in step S52, a part of the oxide layer is removed through such a process as photolithography and dry etching or photolithography and wet etching, to expose the electrical connection portion 1; and a first metal layer 302 is deposited and a metal routing 303 is formed. A part of the metal routing is electrical connection signal line deployment. The deployment of the metal routing 303 may be adjusted according to different design requirements and different structures of the external circuits, to reasonably arrange the electrical connection points, achieve an optimized connection to the external circuits. In this embodiment, the external circuit corresponding to the electrical connection layer is an ASIC circuit.

In step S53, a passivation layer (not shown) is deposited to function as a protection layer. The silicon oxide or silicon nitride material may be used for the passivation layer. The passivation layer manufactured by using various deposition processes, such as low pressure chemical vapor deposition (LPCVD), or plasma enhanced chemical vapor deposition (PECVD), or thermal oxidation process. The purpose is to isolate the metal routing 303 formed in step S52, and achieve the function of shielding.

Figure 17:
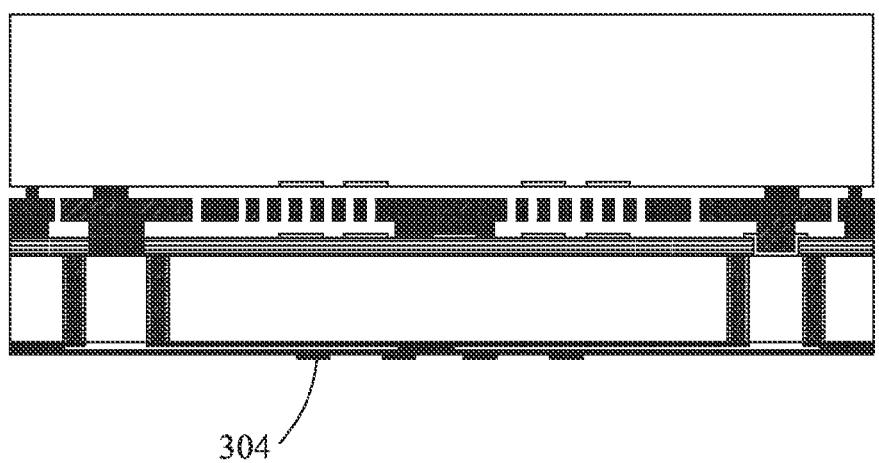
Figure 18:
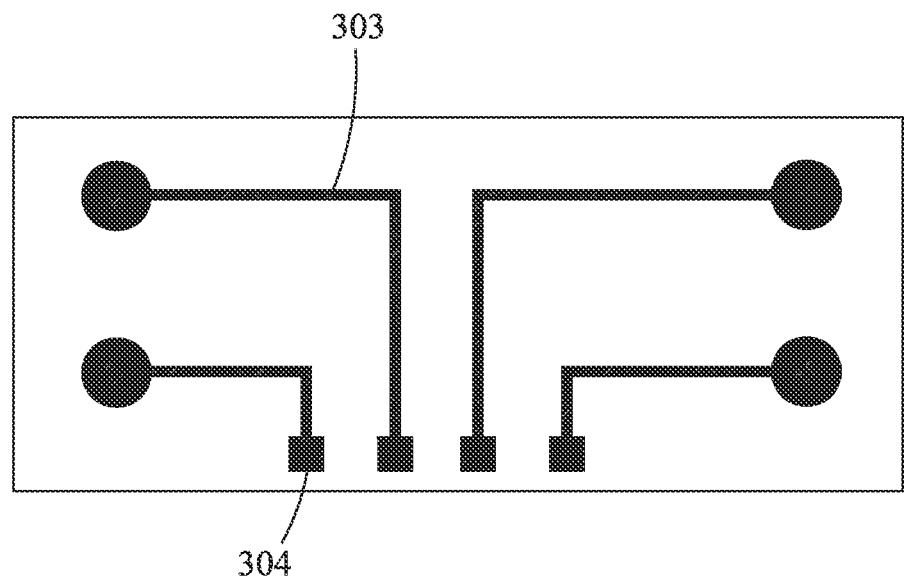

Referring to FIG. 17 and FIG. 18, in step S54, a part of the passivation layer formed in step S53 is removed to expose a part of the metal routing 303 to be bonded with the external part, and a second metal layer 304 is deposited on the exposed metal routing 303. The second metal layer 304 formed in this step is made of aluminum or gold.

Referring to FIG. 19, in step S55, a welding bump 4 is formed on the second metal layer 304 by using the ball grid array package technology.

In steps S1 and S2, when the first electrical bonding point 16 is made of germanium, the second electrical bonding point 22 is made of aluminum; and when the first electrical bonding point 16 is made of gold, and the second electrical bonding point 22 is made of polysilicon. According to combination or cooperation of the above-mentioned materials, the material forming the second package ring and the material forming the second electrical bonding point 22 make the first electrical bonding point 16, the second electrical bonding point 22, the first package ring 17 and the second package ring 23 thinner, thereby reducing the whole volume of the integrated chip 10 with an MEMS and an integrated circuit mounted therein.

With the above-mentioned method for manufacturing the integrated chip 10 with an MEMS and an integrated circuit mounted therein, the wafer level chip scale package (WLSCP) may be achieved, and the volume of the integrated chip 10 is reduced. Additionally, the first chip 1 is bonded with the second chip 2, and the second lead layer 24 is disposed on the second chip 2, wherein the second lead layer 24 and the first lead layer 13 are symmetrically disposed on two sides of the movable sensitive portion 152. Therefore, the bonding gap between the first chip 1 and the second chip 2 may be used reasonably, the parasitic capacitance is effectively used as the detecting capacitance, and the sensitivity of the integrated chip 10 with an MEMS and an integrated circuit mounted therein is increased.

In summary, the integrated chip 10 with an MEMS and an integrated circuit mounted therein according to the present invention has the following advantages:

1. The WLCSP is achieved for the integrated chip 10 with an MEMS and an integrated circuit mounted therein, and the volume of the integrated chip 10 with an MEMS and an integrated circuit mounted therein is reduced.

2. By disposing the second lead layer 24 on the second chip 2, wherein the second lead layer 24 and the first lead layer 13 are symmetrically disposed on two sides of the movable sensitive portion 152, the bonding gap between the first chip 1 and the second chip 2 may be used reasonably, the parasitic capacitance is effectively used as the detecting capacitance, and the sensitivity of the integrated chip 10 with an MEMS and an integrated circuit mounted therein is increased.

3. Because the first chip 1 is bonded with the second chip 2 and the movable sensitive portion 152 of the first chip 1 is formed in a sealed space, and scribing is performed after the integrated chip 10 with an MEMS and an integrated circuit mounted therein is packaged, the problem that the movable sensitive portion 152 of the integrated chip 10 with an MEMS and an integrated circuit mounted therein is easily subject to damage during scribing is solved, the expensive scribing method such as using the laser is avoided, which saves the cost.

4. Because the first chip 1 is bonded with the second chip 2 and the movable sensitive portion 152 of the first chip 1 is formed in a sealed space, the integrated chip 10 of with an MEMS and an integrated circuit mounted therein may be vacuum sealed or the integrated chip 10 with an MEMS and an integrated circuit mounted therein may be sealed in some special inert gas after the integration is completed. Besides, an plastic package manner may be used in the following package, rather than the expensive metal or ceramic package, which reduces the package cost.

5. Likewise, because the first chip 1 is bonded with the second chip 2 and the movable sensitive portion 152 of the first chip 1 is formed in a sealing space, the integrated chip 10 with an MEMS and an integrated circuit mounted therein achieves the electromagnetic shielding effect.

6. In the above-mentioned method for manufacturing the integrated chip 10 with an MEMS and an integrated circuit mounted therein, because the first electrical bonding point 16 and the second electrical bonding point 22, and the first package ring 17 and the second package ring 23 correspondingly use germanium and aluminum or correspondingly use gold and polysilicon, the first electrical bonding point 16, the second electrical bonding point 22, the first package ring 17, and the second package ring 23 may be thinned, thereby reducing the whole volume of the integrated chip 10 with an MEMS and an integrated circuit mounted therein.

Although some preferred embodiments of the present invention have been disclosed for illustration purpose, persons of ordinary skill in the art will appreciate that various improvements, additions, and replacements may be made without departing from the scope and spirit of the present invention as disclosed in the appended claims.

What is claimed is:
1. An integrated chip with a micro-electro-mechanical system (MEMS) and an integrated circuit mounted therein, comprising:
  a first chip, which comprises a first substrate defining a top-to-bottom direction, an electrical connection portion disposed in the first substrate and extending from the top face to the bottom face, an oxide layer disposed on a top face of the first substrate, an MEMS component layer disposed on the substrate and comprising a movable sensitive portion movable in a horizontal plane perpendicular to the top-to-bottom direction and a fixing portion with portions thereof penetrating the oxide layer to electrically connect with the electrical connection portion, a first lead layer formed on the oxide layer and below the movable sensitive portion with a portion thereof electrically connecting with the MEMS component layer, a first electrical bonding point disposed on the fixing portion of the MEMS component layer, an electrical connection layer disposed on an bottom face of the first substrate, wherein the first electrical bonding point and the electrical connection layer are electrically connected via the electrical connection portion and the MEMS component layer; and
  a second chip, which comprises a second substrate with a bottom surface toward the top face of the first substrate, the second chip being disposed on the first chip, the second chip comprising a second lead layer disposed on the bottom surface of the second substrate and a second electrical bonding point disposed on and below the bottom surface of the second substrate, the second electrical bonding point electrically connecting with the second lead layer and bonded with the first electrical bonding point, the second lead layer and the first lead layer being symmetrically disposed on two sides of the movable sensitive portion.

2. The integrated chip according to claim 1, wherein the first chip further comprises an isolation portion disposed in the first substrate and disposed around the periphery of the electrical connection portion.

3. The integrated chip according to claim 2, wherein the isolation portion comprises a through hole passing through the first substrate, a polysilicon layer disposed in the through hole and a silicon oxide layer disposed around the periphery of the polysilicon layer and contact directly with an inner face of the through hole.

4. The integrated chip according to claim 2, wherein the isolation portion comprises a through hole passing through the first substrate and a silicon oxide filling the through hole.

5. The integrated chip according to claim 2, wherein the isolation portion is annular viewed from a bottom view of the first substrate.

6. The integrated chip according to claim 2, wherein the first chip further comprises a first package ring disposed on the MEMS component layer, the first package ring being an outer side of the first electrical bonding point in a traverse direction which is perpendicular to the top-to-bottom direction, and wherein the second chip further comprises a second package ring bonded with the first package ring, the second package ring being disposed on and below the bottom surface of the second substrate and being an outer side of the second electrical bonding point in the traverse direction.

7. The integrated chip according to claim 6, wherein the first electrical bonding point and the first package ring are formed from germanium, while the second electrical bonding point and the second package ring are formed from aluminum.

8. The integrated chip according to claim 6, wherein the first electrical bonding point and the first package ring are formed from gold, while the second electrical bonding point and the second package ring are formed from polysilicon.

9. An integrated chip with a micro-electro-mechanical system (MEMS) and an integrated circuit mounted therein, comprising:
  a first chip, which comprises:
    a first substrate defining a top-to-bottom direction, which defines a top face and a bottom face opposite to the top face and forms thereinwith an electrical connection portion extending from the top face to the bottom face;
    an oxide layer disposed on the top face of the first substrate;
    an MEMS component layer, a part of which is disposed on the first substrate and another part of which is disposed above the oxide layer, wherein the MEMS component layer comprises a movable sensitive portion movable in a horizontal plane perpendicular to the top-to-bottom direction and a plurality of fixing portions with a part thereof penetrating the oxide layer to electrically connect with the electrical connection portion formed in the first substrate, the part thereof disposed on the first substrate being the same part penetrating the oxide layer;
    a first lead layer formed on the oxide layer and below the movable sensitive portion with portion thereof electrically connecting with the MEMS component layer;
    a first electrical bonding point disposed on the fixing portion of the MEMS component layer;
    an electrical connection layer disposed below the bottom face of the first substrate, wherein the first electrical bonding point and the electrical connection layer are electrically connected through the electrical connection portion; and
  a second chip with the integrated circuit mounted therein, the second chip comprising a second substrate with a bottom surface toward the top face of the first substrate, a second lead layer disposed on the bottom surface of the second substrate and a second electrical bonding point disposed on and below the bottom surface of the second substrate and electrically connecting with the second lead layer, wherein the second chip is attached to first chip with the second electrical bonding point connected with the first electrical bonding point and the second lead layer being symmetrical with the first disposed lead layer along the horizontal plane where the movable sensitive portion located.

10. The integrated chip according to claim 9, wherein the first chip further comprises a sacrifice layer disposed on the oxide layer, the MEMS component layer being disposed on the sacrifice layer and at least one part of the fixing portions penetrating the sacrifice layer to electrically connect with a part of the first lead layer on the oxide layer, and wherein the sacrifice layer comprising a removed region to expose a part of the oxide layer and the first lead layer on the oxide layer allowing the part of the fixing portions penetrating the oxide layer and the first lead layer facing to the movable sensitive portion.

11. The integrated chip according to claim 9, wherein the first chip further comprises an isolation portion disposed in the first substrate and around the periphery of the electrical connection portion, the isolation portion insulatively isolating the electrical connection portion from other parts of the first substrate.

12. The integrated chip according to claim 11, wherein the isolation portion comprises a through hole passing through the first substrate, a polysilicon layer disposed in the through hole and a silicon oxide layer disposed around the periphery of the polysilicon layer and contact directly with an inner face of the through hole.

13. The integrated chip according to claim 11, wherein the isolation portion comprises a through hole passing through the first substrate and a silicon oxide filling the through hole.

14. The integrated chip according to claim 11, wherein the first chip further comprises another oxide layer disposed on the bottom face of the first substrate, the another oxide layer being removed part thereof to expose the electrical connection portion, the electrical connection layer being disposed on the another oxide layer to electrically connecting with the electrical connection portion.

* * * * *